(12) United States Patent
Theil (10) Patent No.: US 6,649,993 B2
(45) Date of Patent: Nov. 18, 2003

(54) SIMPLIFIED UPPER ELECTRODE CONTACT STRUCTURE FOR PIN DIODE ACTIVE PIXEL SENSOR

(75) Inventor: Jeremy A. Theil, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/810,852

(22) Filed: Mar. 16, 2001

(65) Prior Publication Data

US 2002/0130380 A1 Sep. 19, 2002

(51) Int. Cl.⁷ .............................................. H01L 31/117
(52) U.S. Cl. .................. 257/458; 257/444; 257/457; 257/290; 257/291; 257/656; 327/503
(58) Field of Search ................. 257/444, 458, 257/758, 431, 449, 59, 72, 457, 656, 290, 291; 327/503

(56) References Cited

U.S. PATENT DOCUMENTS

| 5,408,130 A | * | 4/1995 | Woo et al. ................... 257/750 |
| 6,018,187 A | * | 1/2000 | Theil et al. .................. 257/444 |
| 6,051,867 A | | 4/2000 | Theil et al. .................. 257/444 |
| 6,114,739 A | | 9/2000 | Theil et al. .................. 257/458 |

* cited by examiner

*Primary Examiner*—Eddie Lee
*Assistant Examiner*—Matthew C Landau (57) ABSTRACT

An active pixel sensor having a transparent conductor that directly contacts a conductive element in an interconnection structure to electrically connect the transparent conductor to a pixel sensor bias voltage is provided. The active pixel sensor includes a semiconductor substrate, the interconnection layer, which is formed over the substrate, and a pixel interconnection layer formed over the interconnection layer. Photo sensors that include a pixel electrode, an I-layer, and may include a P-layer are formed over the pixel interconnection layer. The transparent conductor is formed over the photo sensors and the conductive element exposed on the surface of the interconnection layer.

10 Claims, 6 Drawing Sheets

SIMPLIFIED UPPER ELECTRODE CONTACT STRUCTURE FOR PIN DIODE ACTIVE PIXEL SENSOR

BACKGROUND OF THE INVENTION

1. Field of the Invention

The present invention relates generally to PIN photo diode active pixel sensors. In particular, the present invention relates to an elevated PIN diode sensor with a simplified upper electrode contact structure.

2. Description of the Background

Image sensors such as charged coupled devices (CCDs) and active pixel sensors are used in a wide range of applications such as digital cameras, camcorders, and night vision enhancement systems. In these applications, light detected at an array of such image sensors is converted to electrical signals that have amplitudes proportional to the intensity of the light. Thus, the image sensors can convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact, and require low power consumption.

Historically, image sensors have predominantly been CCDs. CCDs are relatively small and can provide a high-fill factor. However, CCDs are very difficult to integrate with digital and analog circuitry. Furthermore, CCD systems dissipate large amounts of power and suffer from image smearing problems.

Active pixel sensors are an alternative to CCD sensors. Active pixel sensors can be fabricated using standard CMOS processes. Therefore, active pixel sensors can easily be integrated with digital and analog signal processing circuitry. Further, CMOS circuits dissipate small amounts of power.

Figure 1:
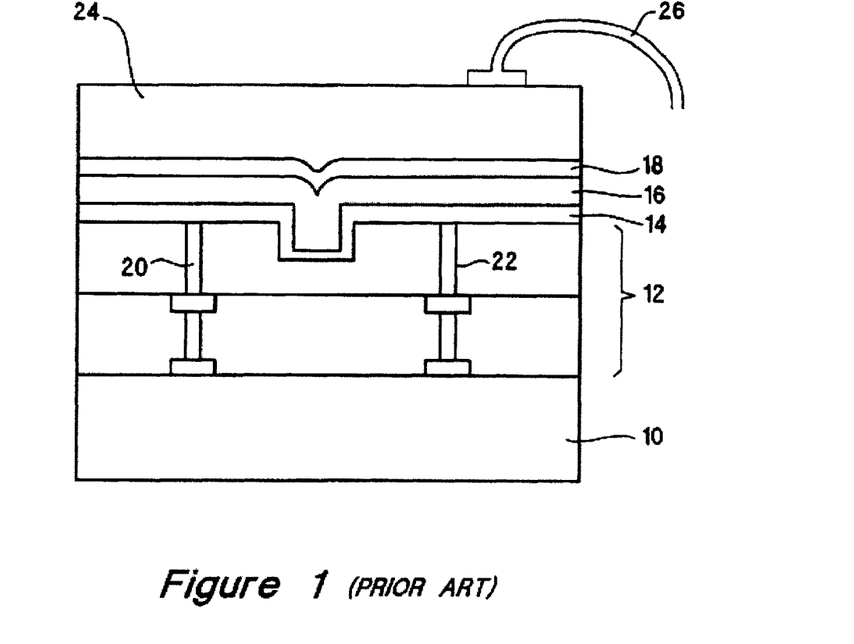
FIG. 1 illustrates a cross-section of a prior art array of image sensors.

FIG. 1 shows a cross-section of a prior art array of image sensors. This array of image sensors includes PIN diode sensors located over a substrate 10. An interconnection structure 12 electrically connects an N-layer (N-type layer) 14 of the PIN diodes to the substrate 10, such as a silicon substrate. An I-layer (intrinsic layer) 16 is formed over the N-layer 14. A P-layer (P-type layer) 18 is formed over the I-layer 16. The P-layer 18, the I-layer 16 and the N-layer 14 form the array of PIN diode sensors. A first conductive via 20 electrically connects a first diode sensor to the substrate 10, and a second conductive via 22 electrically connects a second diode sensor to the substrate 10. A transparent conductive layer 24 is located over the array of diode sensors. A conductive lead 26 is connected to the transparent conductive layer 24. The conductive lead 26 is connected to a bias voltage that allows biasing of the P-layer 18 of the array of PIN diode sensors to a selected voltage potential.

A limitation of the image sensor structure of FIG. 1 is the electrical connection between the conductive lead 26 and the transparent conductive layer 24. The transparent conductive layer 24 must be electrically conductive to allow biasing of the PIN diodes, and must be transparent to allow the PIN diodes to receive light. Generally, it is very difficult to bond to the types of materials that must be used to form the transparent conductive layer 24. Therefore, the conductive lead 26 must be attached to the transparent conductive layer 24 with the aid of some type of clamp or support structure. The result is an electrical connection which is not reliable and which is expensive to produce.

It is desirable to have an active pixel sensor formed adjacent to a substrate in which a transparent conductor is reliably electrically connected to a pixel sensor bias voltage which originates on the substrate.

SUMMARY

An active pixel sensor is provided that includes a semiconductor substrate, an interconnection structure adjacent to the substrate, and a sensor interconnect structure adjacent to the interconnection structure. Photo sensors that contain individual pixel electrodes and an I-layer are formed over the sensor interconnect structure. A transparent conductor is deposited over both the photo sensors and an exposed conductive element in the interconnection structure. The conductive element passes through the interconnection structure to the substrate and allows a pixel sensor bias voltage that originates from circuitry within the substrate to be applied to the transparent conductor. A second conductive element in the interconnection layer is left exposed to allow connection to external packaging or other devices.

The substrate may contain active circuits to sense charge accumulation by the photo sensors due to the photo sensors receiving light. The photo sensors may include an additional P-layer formed between the I-layer and the transparent conductor, with the inner surface of the transparent conductor electrically connected to the P-layer, the I-layer, and the pixel interconnect layer.

In one embodiment, the semiconductor substrate contains a junction contact layer over which the interconnection structure has been removed. The transparent conductor is deposited over the photo sensors and the exposed junction contact layer in the substrate itself. This allows a pixel sensor bias voltage that originates from circuitry within the substrate to be applied directly to the transparent conductor.

In one embodiment, the active pixel sensor is formed by forming the interconnection structure adjacent the substrate and the sensor interconnect structure adjacent the interconnection structure. At least one pixel electrode is formed adjacent the sensor interconnect structure and an I-layer is deposited over the at least one pixel electrode and pixel interconnect layer. A portion of the I-layer and pixel interconnect layer is removed to expose the conductive element. A transparent conductor is deposited over the I-layer and conductive element.

DETAILED DESCRIPTION

Figure 2:
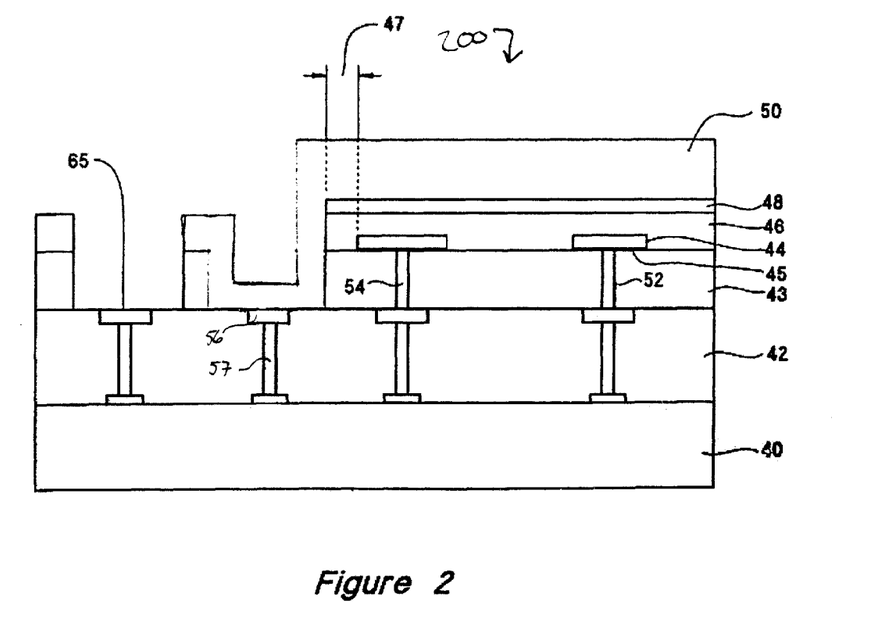
FIG. 2 is a cross-sectional view of an active pixel sensor in accordance with an embodiment of the invention.

FIG. 2 shows one embodiment of an active pixel sensor 200. In sensor 200, the transparent conductor 50 directly contacts conductive element 56, 57 in an interconnection structure 42 to electrically connect the transparent conductor 50 to a pixel sensor bias voltage that originates in the substrate 40.

In the structure of sensor 200, the interconnection structure 42 is formed adjacent to the substrate 40. A sensor interconnect structure 43 is formed adjacent to the interconnection structure 42. Each pixel sensor of an array of pixel sensors includes an individual pixel electrode 44 and an inner metal section 45. Pixel electrodes 44 and the inner metal section 45 are formed adjacent to the sensor interconnect structure 43. Each individual pixel electrode 44 is electrically connected to the substrate 40 through individual conductive vias 52, 54 in the sensor interconnect structure 43. An I-layer (intrinsic layer) 46 is formed adjacent to the pixel electrodes 44. A P-layer (P-type layer) 48 is formed adjacent to the I-layer 46.

A transparent conductor 50, which may be any conductive contact layer, is formed adjacent to the P-layer 48. The transparent conductor 50 is electrically connected to the substrate 40 through direct contact with a conductive element 56, 57 in the interconnection structure 42. In the sensor 200 illustrated in FIG. 2, the conductive element is shown as a conductive contact region 56, e.g., a bond pad, and metal plug 57. However any conductive element, such as a metal line, that passes through the interconnection structure 42 may be used to form the electrical connection to the substrate 40.

Sensor structure 200 generally includes additional conductive elements, such as bond pad 65, that do not contact conductor 50 and allow connection of the sensor to packaging or other external device.

The pixel sensors are photo sensors that conduct charge upon receiving light. The substrate 40 generally includes sense circuitry and signal processing circuitry. The sense circuitry senses how much charge the pixel sensors have collected during a "shutter" period. The amount of charge conducted represents the intensity of light received by the pixel sensors during the shutter period. Generally, the substrate circuitry can be CMOS (complementary metal oxide silicon), BiCMOS or Bipolar and can be any compound semiconductor such as, e.g., GaAs or InP. The substrate can include various types of substrate technology including charged coupled devices.

Typically, the interconnection structure 42 is a standard CMOS interconnection structure. The structure and methods of forming this interconnection structure are well known in the field of electronic integrated circuit fabrication. The interconnection structure 42 can be a subtractive metal structure, or a single or dual damascene structure.

The sensor interconnect structure 43 is typically formed from silicon oxide or a silicon nitride with metal filled vias. The sensor interconnect structure 43 provides reliability and structural advantages to the pixel sensor structure. The pixel interconnect structure allows for the formation of thin pixel electrodes 44 because the pixel electrodes 44 are formed over silicon rather than a metal pad located on the interconnection structure 42. The pixel interconnect structure 43 electrically connects the pixel electrodes 44 to the interconnection structure 42.

The conductive vias 52, 54 pass through the sensor interconnect structure 43 and electrically connect the pixel electrodes 44 to the substrate 40. The sensor interconnect structure 43 allows this interconnection circuitry to be tightly packed because the vias 52, 54 are located directly underneath the pixel electrodes, which conserves lateral space. Additionally, the sensor interconnect structure 43 allows the formation of vias 52, 54 having a minimal diameter. Typically, conductive vias 52, 54 having a minimal diameter are formed from tungsten using a CVD process. Tungsten is generally used during fabrication because tungsten can fill high aspect ratio holes. That is, tungsten can be used to form narrow and relatively long interconnections. However, the temperatures required to form tungsten vias with a CVD process are greater than many of the materials (amorphous silicon for example) used to form the pixel electrodes can withstand. By forming the sensor interconnect structure 43 over the substrate 40, and the pixel electrodes 44 over the sensor interconnect structure 43, the vias 52, 54 can be formed before the pixel electrodes 44, and thus, the pixel electrodes 44 are not subjected to the high temperatures required for the formation of vias 52, 54. Other materials that may be used to form the conductive vias 52, 54 include copper, aluminum, or any other electrically conductive material.

The inner metal section 45 typically includes a thin conductive material. The inner metal section 45 may be formed, for example, from a degenerately doped semiconductor layer, aluminum, titanium, titanium nitride, copper or tungsten. The inner metal section 45 should be thin (approximately 500 angstroms) and smooth. The inner metal section 45 should be smooth enough so that any surface roughness is substantially less than the thickness of the pixel electrode 44 formed over the inner metal section 45. To satisfy the smoothness requirement, polishing of the inner metal section 45 may be required.

The inner metal section 45 can be optional. However, the inner metal section 45 has a lower resistance than the materials used to form the pixel electrodes 44. Therefore, the inner metal section 45 provides better current collection.

The pixel electrodes 44 are generally formed from a doped semiconductor. The doped semiconductor can be, for example, an N-layer (N-type layer) of amorphous silicon, which may be doped with, for example, phosphorous. Alternatively, the pixel electrodes 44 can be implemented with a conductive nitride, e.g., titanium nitride. The pixel electrode must be thick enough and doped heavily enough so that the pixel electrodes 44 do not fully deplete when biased during operation.

Although an N-layer of amorphous silicon is typically used when the active pixel sensors have a PIN diode configuration, the active pixel sensors can include an NIP sensor configuration. In this case, the pixel electrodes 44 are formed from a P-layer, and the P-layer 48 of FIG. 2 is replaced with an N-layer.

The sensor 200 includes an I-layer 46 that is typically formed from a hydrogenated amorphous silicon. I-layer 46 is electrically connected to the transparent conductor 50. The I-layer includes a resistive path between the electrodes 44 and the transparent conductor 50. The resistance of the resistive path between the end electrode (the electrode 44 electrically connected to the conductive via 54) and the transparent conductor 50 is directly dependent on the distance 47. Increasing the resistance minimizes leakage current that flows through the resistive path. Therefore, the end electrode should be located so that a distance 47 between the edge of the end electrode and the transparent conductor 50 is maximized.

The P-layer 48 is generally formed from amorphous silicon. Typically, the P-layer 48 is doped with Boron. The P-layer 48 thickness must generally be controlled to ensure that the P-layer 48 does not absorb too much short wavelength (blue) light.

Another embodiment of sensor 200 does not include a P-layer 48. The P-layer can be eliminated with proper selection of the composition of the material within the transparent conductor 50, and proper selection of the doping levels of the pixel electrodes 44. For this embodiment, the transparent conductor 50 provides a conductive connection between a top surface of the I-layer 46 of the pixel sensors and the interconnection structure 42, rather than just between an edge surface of the I-layer 46 and the interconnection structure 42.

As previously described, the pixel electrodes 44, the I-layer 46, and the P-layer 48 are generally formed from amorphous silicon. However, the pixel electrodes 44, the I-layer 46, and the P-layer 48 can also be formed from amorphous carbon, amorphous silicon carbide, amorphous germanium, or amorphous silicon-germanium. It should be understood that this list is not exhaustive.

The transparent conductor 50 provides a conductive connection between the P-layer 48 and the I-layer 46 of the pixel sensors, and the interconnection structure 42. Transparent conductor 50 is typically transparent to light in the visible wavelength range, but, as sensor 200 may be constructed to detect various wavelengths of electromagnetic radiation, e.g., x-rays, transparent conductor 50 need only be transparent to the relevant wavelengths, and may be any conductive contact layer.

Light that is received by the pixel sensors must pass through the transparent conductor 50. Both the selection of the type of material to be used within the transparent conductor 50, and the determination of the desired thickness of the transparent conductor 50, are based upon minimizing the reflection of light received by the pixel sensor. Minimization of the reflection of light received by the pixel sensor helps to optimize the amount of light detected by the pixel sensor. Transparent conductor 50 is typically formed from an indium tin oxide, but may also be formed from titanium nitride, thin silicide, or certain types of transition metal nitrides or oxides.

A protective layer may be formed over the transparent conductor 50. The protective layer provides mechanical protection, electrical insulation, and can provide some antireflective characteristics, and is typically formed from a thin dielectric film such as $SiO_2$, which may be, for example, 5,000 angstroms thick.

Another embodiment includes Schottky diode sensors. Schottky diode sensors include several different configurations. A first Schottky diode configuration includes the electrodes 44 being formed from a conductive metal. This configuration also includes the I-layer 46 and the P-layer 48. A second Schottky diode configuration includes the electrodes 44 being formed from a conductive metal and the P-layer 48 being replaced with a transparent conductor or a transparent silicide. A third Schottky diode configuration includes the electrodes 44 being formed from an N-layer, and the P-layer being replaced with a transparent conductor. The transparent conductor of the third configuration must exhibit a proper work function. Conductive metals that may be used for the Schottky configurations include, but are not limited to, chrome, platinum, aluminum and titanium.

Figure 3:
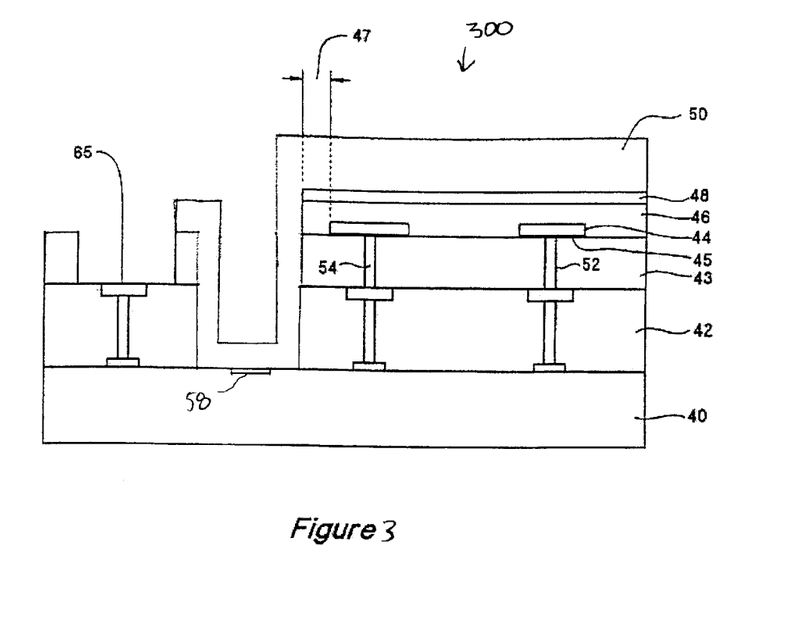
FIG. 3 is a cross-sectional view of an active pixel sensor in accordance with another embodiment of the invention.

FIG. 3 illustrates another embodiment for an active pixel sensor. Sensor 300 is similar to sensor 200 except that instead of using conductive element 56, 57 through interconnection structure 42 to electrically connect transparent conductor 50 to substrate 40, transparent conductor 50 directly contacts the substrate 40. The semiconductor substrate 40 has, for example, a junction contact layer 58 made from, e.g., titanium silicide, that is electrically connected to a pixel sensor voltage that originates in circuitry within the substrate 40. The physical contact between the transparent conductor 50 and the junction contact layer 58 electrically connects the transparent conductor 50 to the pixel sensor voltage.

FIGS. 4–8 illustrate a process sequence that can be used to fabricate an active pixel sensor 200 as illustrated in FIG. 2.

Figure 4:
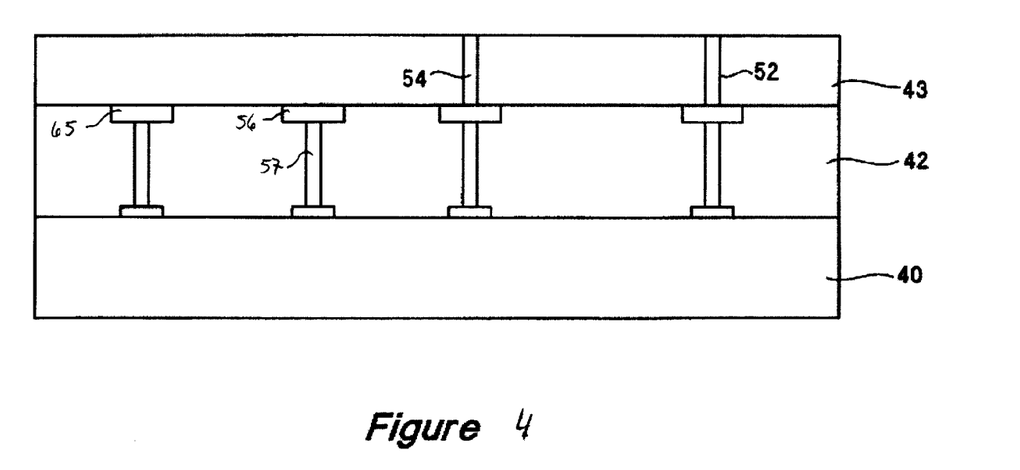
FIG. 4 is a cross-sectional view of a substrate with an interconnection structure and sensor interconnect structure formed over the substrate.

FIG. 4 shows a substrate 40 with a standard interconnection structure 42 and a sensor interconnect structure 43 formed over the substrate 40. The methods of forming structures 42, 43 are well known in the field of electronic integrated circuit fabrication. The interconnection structure 42 can be a subtractive metal structure, or a single or dual damascene structure, and typically includes metal plugs 57, conductive contact regions 56, or other conductive element such as metal lines, and bond pads 65. The conductive vias 52, 54 are typically formed using a chemical vapor deposition (CVD) process of tungsten or other metal.

Figure 5:
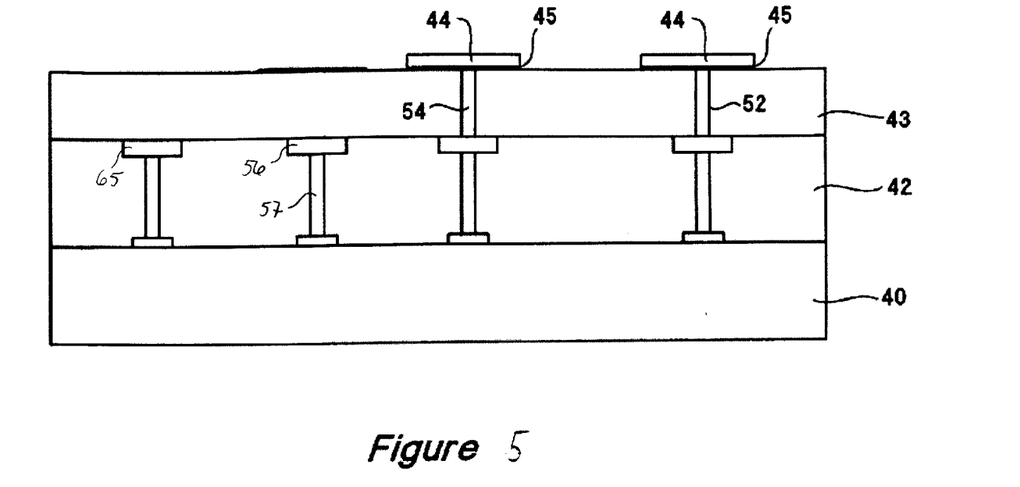
FIG. 5 is a cross-sectional view of pixel electrodes deposited on the sensor interconnect structure illustrated in FIG. 4.

FIG. 5 shows pixel electrodes 44 and inner metal sections 45 deposited on the sensor interconnect structure 43. An inner metal layer and a pixel electrode layer are first deposited on the sensor interconnect structure 43. The pixel electrode layer and an inner metal layer are then etched according to a predetermined pattern to form the pixel electrodes 44 and the inner metal layers 45. An individual pixel electrode 44 and inner metal section 45 are formed for each pixel sensor.

The pixel electrodes 44 are typically deposited using plasma enhanced chemical vapor deposition (PECVD). The PECVD is performed with a phosphorous containing gas, for example, $PH_3$. A silicon containing gas, such as $Si_2H_6$ or $SiH_4$, is included when forming amorphous silicon pixel electrodes 44. The predetermined pixel electrode pattern is formed through a wet or dry etch of the deposited pixel electrode material.

Figure 6:
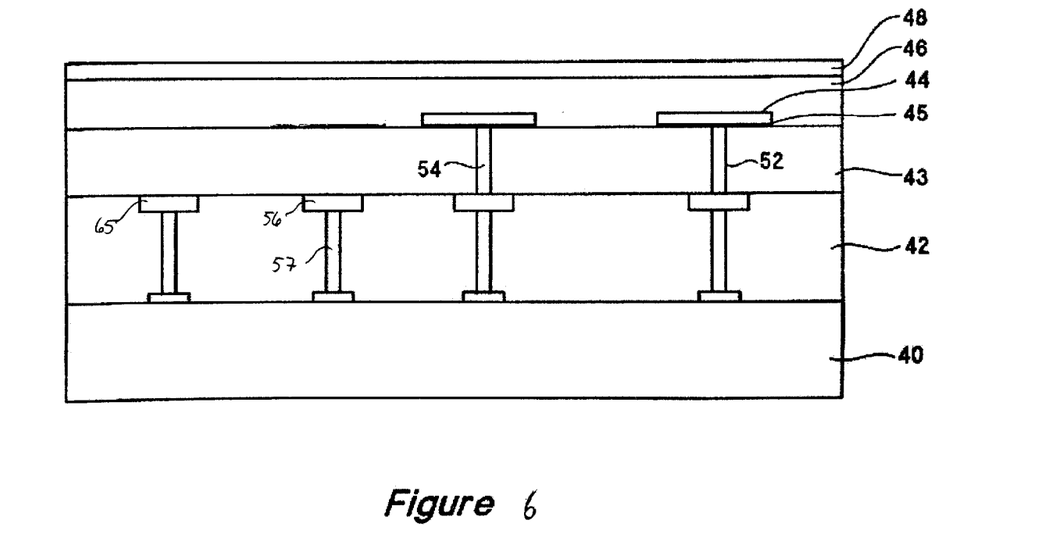
FIG. 6 is a cross-sectional view of an I-layer and P-layer deposited over the pixel electrodes illustrated in FIG. 5.

FIG. 6 shows an I-layer 46 and a P-layer 48 deposited over the plurality of pixel electrodes 44. The I-layer 46 is generally deposited using a PECVD or reactive sputtering process. The PECVD must include a silicon containing gas. The deposition should be at a low enough temperature so that hydrogen is retained within the film. The P-layer 48 can also be deposited using PECVD. The PECVD is performed with a Boron containing gas, for example $B_2H_6$. A silicon containing gas is included when forming an amorphous silicon P-layer 48.

Figure 7:
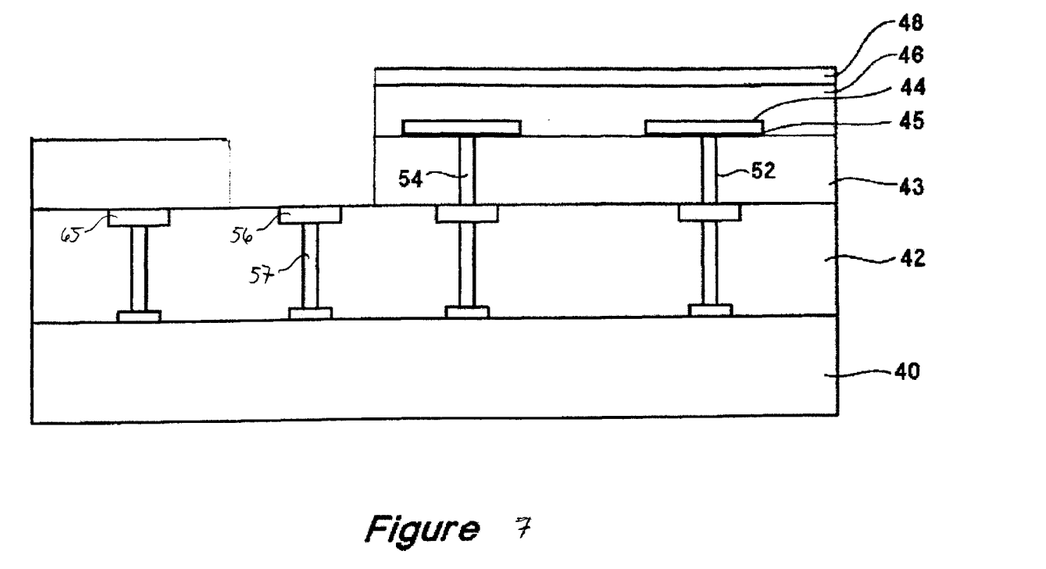
FIG. 7 is a cross-sectional view showing the I-layer, P-layer and pixel interconnect layer of FIG. 6 selectively etched to expose a conductive contact region in the interconnection structure.

FIG. 7 shows the P-layer 48 and the I-layer 46 having been etched to remove these layers from the portion of the interconnect structure 43 which lies over the conductive contact region 56 and bond pad 65. The sensor interconnect structure 43 is then selectively etched from the region over conductive contact region 56 to expose conductive contact regions 56. As discussed above, the conductive contact region 56 is electrically connected to a reference voltage on the substrate 40 that is used to bias the array of pixel sensors.

Figure 8:
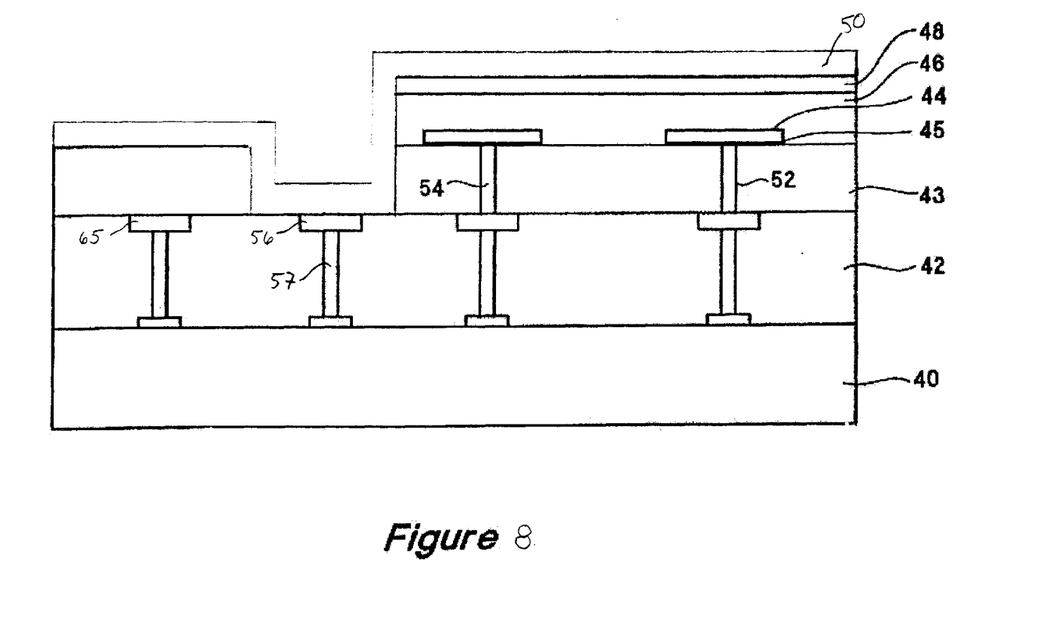
FIG. 8 is a cross-sectional view of a transparent conductor deposited over the structure illustrated in FIG. 7.

FIG. 8 shows the transparent conductor 50 deposited over the P-layer 48 and conductive contact region 56 to provide an electrical connection between the P-layer 48, the I-layer 46, and the substrate 40. The transparent conductor 50 is generally deposited through a reactive sputtering process, which is well known in the art of integrated circuit fabrication. However, the transparent conductor 50 can also be grown by evaporation. If the transparent conductor 50 is formed from titanium nitride, then typically a CVD process or a sputtering process must be used to deposit the transparent conductor 50.

The transparent conductor 50 and the sensor interconnect structure 43 are then etched according to a predetermined pattern to expose additional conductive elements such as bond pad 65. This etching allows access to the additional conductive elements of the interconnection structure 42, resulting in the structure of sensor 200 illustrated in FIG. 2.

To form the sensor structure 300 illustrated in FIG. 3, a similar process sequence as that illustrated in FIGS. 4–8 may be used with some modification. The formation of conductive element 56, 57 in interconnection structure 42 is unnecessary. Additionally, when etching through the sensor interconnect structure 43, as illustrated in FIG. 7, the etch is continued to remove a portion of the interconnection structure 42 over the junction contact layer 58 (shown in FIG. 3), to expose the junction contact layer on the surface of substrate 40. Transparent conductor 50 is then deposited and etched as described above in reference to FIG. 8.

Figure 9:
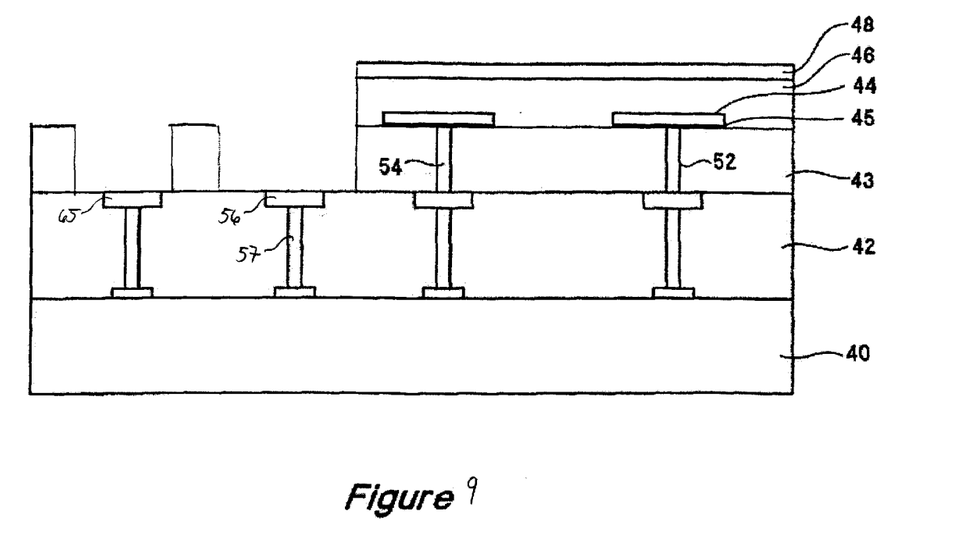
FIG. 9 is a cross-sectional view showing the I-layer, P-layer and pixel interconnect layer of FIG. 6 selectively etched to expose both the conductive contact region and bond pad in the interconnection structure.
Figure 10:
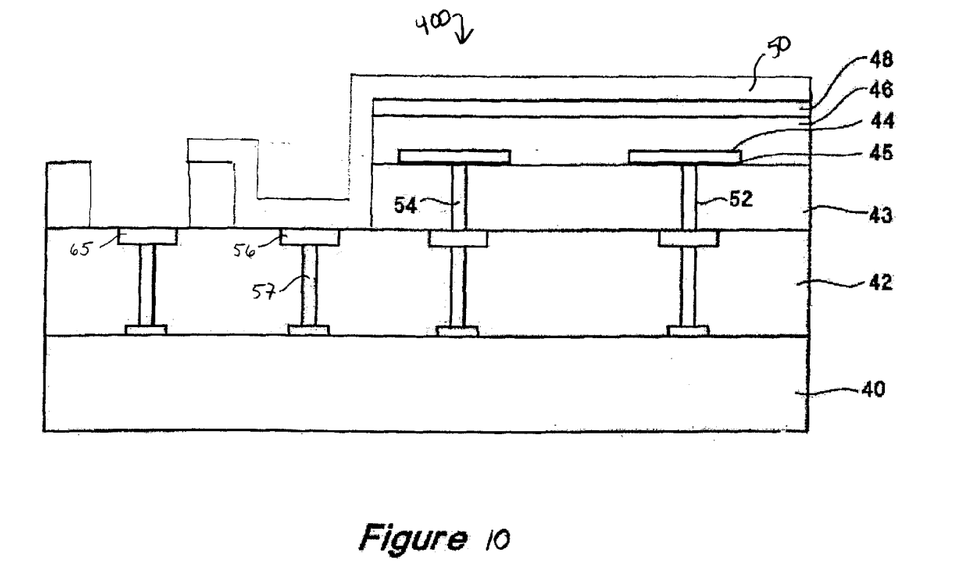
FIG. 10 is a cross-sectional view of a transparent conductor that has been deposited over the structure illustrated in FIG. 9 and selectively etched from bond pad 65.

FIGS. 9 and 10 illustrate another process sequence that may be used to form the active pixel sensors. In this embodiment, after depositing the I-layer 46 and P-layer 48, as was illustrated in FIG. 5, portions of the I-layer 46 and P-layer 48 which are not part of the photo sensor diode (e.g., not over pixel electrodes 44) are selectively etched from the structure. The interconnection structure 42 is then selectively etched to remove interconnection structure 42 that is over the conductive contact region 56 and bond pad 65, as illustrated in FIG. 9.

A layer of transparent conductor 50 is then deposited over the entire structure of FIG. 9, and then patterned to remove conductor 50 from everywhere except over the photo sensor diode and conductive contact region 56, leaving sensor structure 400 as illustrated in FIG. 10. Thus, in sensor 400, the transparent conductor 50 remains only over the photo sensor and conductive element 50, which may reduce the likelihood of shorting the active pixel sensor when making contact to bond pad 65.

In the process sequence illustrated in FIGS. 4–8 and 9–10, two selective etches are needed to obtain the structures illustrated in FIG. 7 and FIG. 9. A portion of the I-layer 46 and P-layer 48 is first selectively etched from the region that is over the conductive contact region 56 and bond pad 65. A portion of the sensor interconnect structure 43 is then selectively etched from the region over conductive contact region 56, as shown in FIG. 7, or from both the region over conductive contact region 56 and bond pad 65, as shown in FIG. 9. This process sequence may be simplified, as illustrated in FIGS. 11 and 12.

Figure 11:
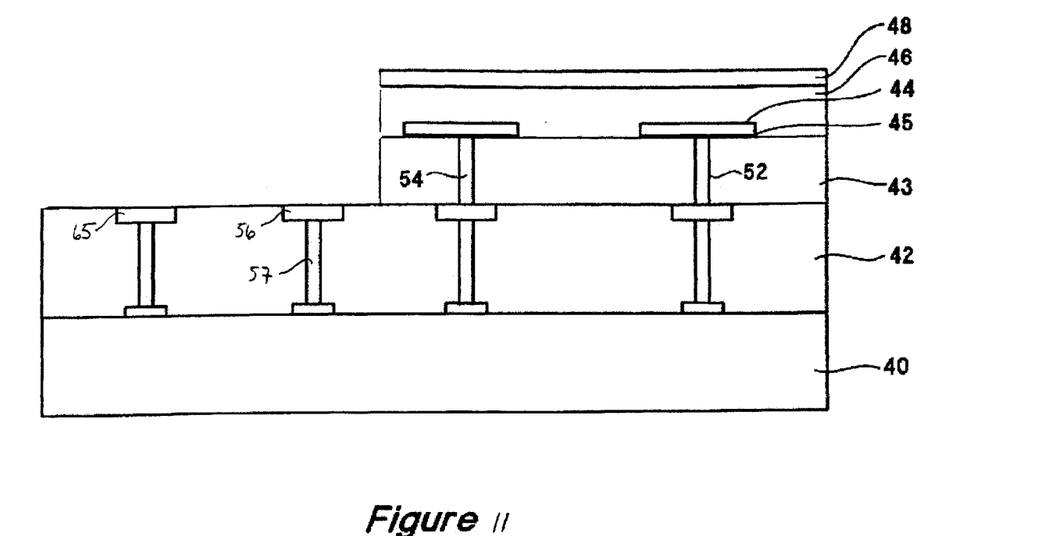
FIG. 11 is a cross-sectional view showing the I-layer, P-layer, and pixel interconnect layer of FIG. 6 selectively etched to expose both a conductive contact region and bond pad in the interconnection structure.
Figure 12:
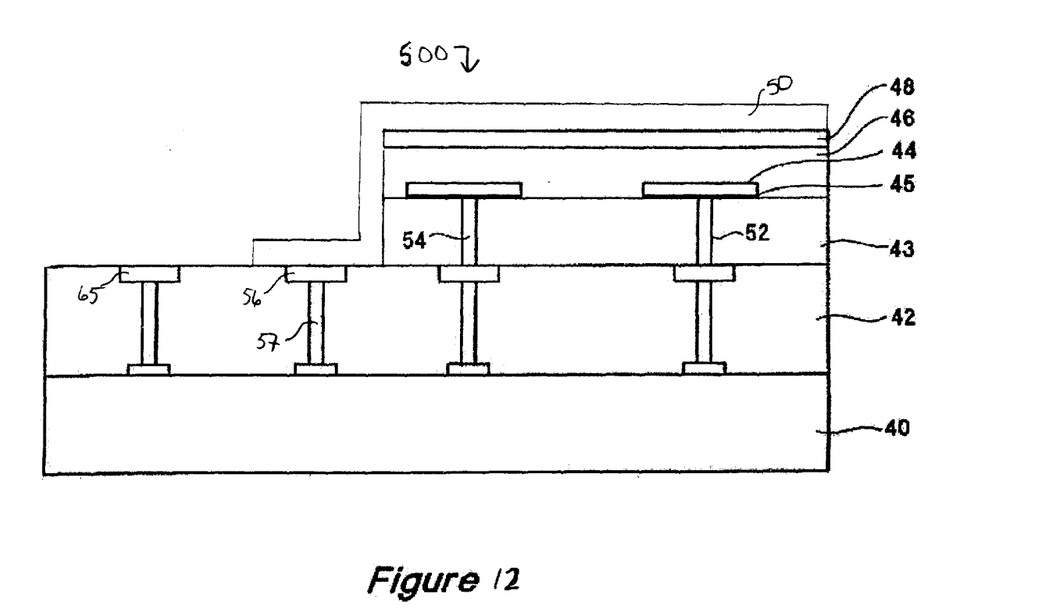
FIG. 12 is a cross-sectional view of a transparent conductor deposited over the structure illustrated in FIG. 11 and selectively etched from one of the bond pads.

After depositing the I-layer 46 and P-layer 48, as was illustrated in FIG. 6, the portion of the I-layer 46, P-layer 48, and sensor interconnect structure 43 that is over both conductive contact region 56 and bond pad 65 can be entirely removed, as illustrated in FIG. 11. These layers may be removed in a single etch, which is typically a wet or dry chemical etch as described above.

The transparent conductor 50 is then deposited over the P-layer 48 and the exposed conductive contact region 56 and bond pad 65. The transparent conductor 50 is subsequently etched according to a predetermined pattern to expose to bond pad 65 of the interconnection structure 42, resulting in active pixel sensor structure 500 of FIG. 12. The sensor structure 500 can thus be formed with fewer processing steps than the sensor structure 200 of FIG. 2. However, sensor interconnect structure 43 may contain a passivation layer, so removal of the entire layer as illustrated in FIG. 11 may leave the sensor 500 unpassivated.

As stated previously, after deposition of transparent conductor 50, a protective layer (not shown) may be formed over the transparent conductor 50 using conventional methods. The protective layer provides mechanical protection and electrical insulation, and can provide some anti-reflective characteristics.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the scope of this invention.

What is claimed is:

1. An active pixel sensor comprising:
    a semiconductor substrate;
    an interconnection structure adjacent to the substrate and containing a conductive element that passes through the interconnection structure to the substrate;
    a sensor interconnect structure adjacent to the interconnect on structure;
    at least one photo sensor adjacent to the sensor interconnect structure, each photo sensor comprising an individual pixel electrode;
    an intrinsic layer formed over the at least one pixel electrode; and
    a conductive contact layer formed over the intrinsic layer, wherein an inner surface of the conductive contact layer is physically and electrically connected to the intrinsic layer, and the inner surface of the conductive contact layer is physically and directly contacting the interconnection structure and conductive element to electrically connect the conductive contact layer to the substrate.

2. The active pixel sensor of claim 1, wherein said conductive element comprises a bond pad.

3. The active pixel sensor of claim 1, wherein said substrate comprises active circuits which sense charge accumulated by the photo sensors due to the photo sensors receiving light.

4. The active pixel sensors of claim 1, wherein said interconnection structure comprises a second conductive element that is exposed on the interconnection structure.

5. The active pixel sensors of claim 1, wherein the sensor interconnect structure electrically interconnects the pixel electrodes to the substrate.

6. The active pixel sensor of claim 1, wherein each pixel electrode comprises an N-type layer.

7. The active pixel sensor of claim 1, wherein each pixel electrode comprises a P-type layer.

8. The active pixel sensor of claim 1, wherein each pixel electrode comprises a conductive metal.

9. The active pixel sensor of claim 1, further comprising a P-type layer formed between the intrinsic layer and the conductive contact layer, the inner surface of the conductive contact layer electrically connected to the P-type layer, the intrinsic layer, and the sensor interconnect structure.

10. The active pixel sensor of claim 1, wherein the conductive contact layer comprises indium tin oxide.

* * * * *